United States Patent
Lee et al.

(10) Patent No.: US 9,524,978 B2
(45) Date of Patent: Dec. 20, 2016

(54) 3D NON-VOLATILE MEMORY DEVICE AND METHOD OF MANUFACTURING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); Seok Min Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/505,285

(22) Filed: Oct. 2, 2014

(65) Prior Publication Data

US 2015/0017771 A1   Jan. 15, 2015

Related U.S. Application Data

(62) Division of application No. 13/598,528, filed on Aug. 29, 2012, now Pat. No. 8,878,277.

(30) Foreign Application Priority Data

Dec. 20, 2011 (KR) .......................... 10-2011-0138197

(51) Int. Cl.
*H01L 21/336* (2006.01)
*H01L 27/115* (2006.01)
*H01L 29/66* (2006.01)
*H01L 29/792* (2006.01)

(52) U.S. Cl.
CPC ... *H01L 27/11582* (2013.01); *H01L 29/66833* (2013.01); *H01L 29/7926* (2013.01)

(58) Field of Classification Search
CPC ................... H01L 27/11582; H01L 29/66833; H01L 29/7926
See application file for complete search history.

(56) References Cited

U.S. PATENT DOCUMENTS

| | | | |
|---|---|---|---|
| 2011/0291177 A1* | 12/2011 | Lee | H01L 21/28282 257/324 |
| 2012/0135593 A1* | 5/2012 | Kito | H01L 27/11578 438/589 |
| 2013/0009239 A1* | 1/2013 | Lee | H01L 27/11582 257/330 |
| 2013/0313629 A1* | 11/2013 | Shim | H01L 27/11556 257/324 |

* cited by examiner

*Primary Examiner* — A. Sefer
(74) *Attorney, Agent, or Firm* — IP & T Group LLP

(57) ABSTRACT

A 3D non-volatile memory device includes a pipe gate, at least one first channel layer including a first pipe channel layer formed in the pipe gate and a pair of first source side channel layer and first drain side channel layer connected to the first pipe channel layer, and at least one second channel layer including a second pipe channel layer formed in the pipe gate and positioned over the first pipe channel layer and a pair of second source side channel layer and second drain side channel layer connected to the second pipe channel layer.

12 Claims, 20 Drawing Sheets

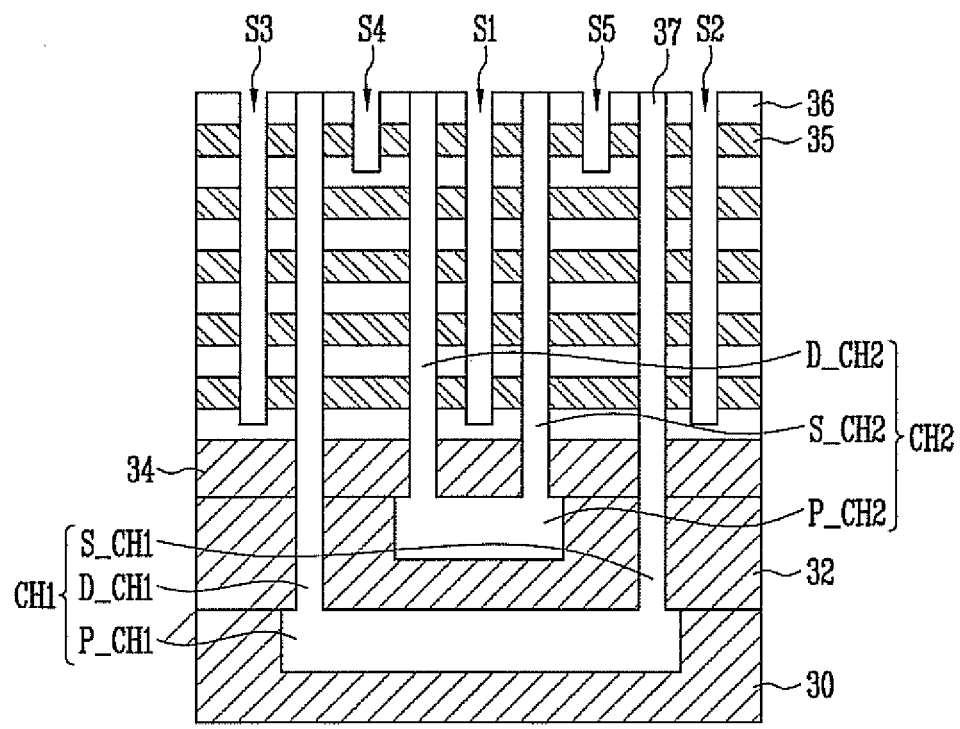

3D NON-VOLATILE MEMORY DEVICE AND METHOD OF MANUFACTURING THE SAME

CROSS-REFERENCE TO RELATED APPLICATION

This application is a division of U.S. patent application Ser. No. 13/598,528 filed on Aug. 29, 2012, which claims priority of Korean patent application number 10-2011-0138197 filed on Dec. 20, 2011. The disclosure of each of the foregoing application is incorporated herein by reference in its entirety.

BACKGROUND

Exemplary embodiments of the present invention relate to a semiconductor device and a method of manufacturing the same and, more particularly, to a 3D non-volatile memory device and a method of manufacturing the same.

A non-volatile memory device is a memory device in which data stored therein is maintained as it is although power supply applied thereto is cut off. As the enhancement of the degree of integration of a memory device having a two-dimensional (2D) structure in which memory cells are formed as a single layer on a silicon substrate has reached the limit, a three-dimensional (3D) non-volatile memory device in which a plurality of memory cells are stacked vertically on a silicon substrate has been proposed.

Hereinafter, a structure and features of the conventional 3D non-volatile memory device and will be described in detail with reference to the accompanying drawings.

FIG. 1 is a perspective view illustrating a structure of the conventional 3D non-volatile memory device. Here, interlayer insulating layers are omitted for the description purposes.

As illustrated in FIG. 1, the conventional 3D non-volatile memory device includes a channel CH including a pipe channel layer P_CH formed in a pipe gate PG and a pair of source side channel layer S_CH and a drain side channel layer D_CH connected to the pipe channel layer P_CH.

Also, the memory device includes source side word lines S_WL surrounding the source side channel layer S_CH and drain side word lines D_WL surrounding the drain side channel layer D_CH. Here, the source side word lines S_WL and the drain side word lines D_WL extend in a first direction I-I', and they are arranged in parallel with each other. Also, at least one source selection line SSL is formed over the source side word lines, and at least one drain selection line DSL is formed over the drain side word lines D_WL.

Here, the source side channel layers S_CH of strings ST0 and S1 neighboring in a second direction II-II' are commonly connected to a single source line SL, and the drain side channel layers DCH of the strings ST0 and S1 extending in the second direction II-II' are commonly connected to a single bit line BL.

However, according to the foregoing structure, since the narrow word lines S_WL and D_WL are stacked high, the word line stacked structure may incline (or tilt). Also, in manufacturing a memory device, by etching stacked interlayer insulating layers and conductive layers, slits are to be formed every between a pair of source side channel layer S_CH and drain side channel layer D_CH constituting a single channel and every between neighboring channels CH. The slits have a narrow width and the etching process has a high degree of difficulty in the foregoing structure of the memory device. In addition, as the degree of integration of a memory device is increased, the number of stacked word lines is further increased accordingly, aggravating the features of the memory device.

BRIEF SUMMARY

Exemplary embodiments of the present invention relate to a three-dimensional (3D) non-volatile memory device in which tilting of word line stacked patterns is eliminated, and a manufacturing method thereof.

A 3D non-volatile memory device according to an embodiment of the present invention includes: a pipe gate; at least one first channel layer including a first pipe channel layer formed in the pipe gate and a pair of first source side channel layer and first drain side channel layer connected to the first pipe channel layer; and at least one second channel layer including a second pipe channel layer formed in the pipe gate and positioned over the first pipe channel layer and a pair of second source side channel layer and second drain side channel layer connected to the second pipe channel layer.

A method for manufacturing a 3D non-volatile memory device according to an embodiment of the present invention includes: etching a first conductive layer to form first pipe trenches; forming first sacrificial layers in the first pipe trenches; forming a second conductive layer on the first conductive layer with the first sacrificial layers formed therein; etching the second conductive layer to form second pipe trenches overlapping with the respective first pipe trenches; forming second sacrificial layers in the second pipe trenches; and alternately forming first material layers and second material layers on the second conductive layer with the second sacrificial layers formed therein.

BRIEF DESCRIPTION OF THE DRAWINGS

FIGS. 3A to 3D are sectional views illustrating processes of manufacturing a 3D non-volatile memory device according to an embodiment of the present invention.

DESCRIPTION OF EMBODIMENTS

Hereinafter, some exemplary embodiments of the present invention will be described in detail with reference to the accompanying drawings. The figures are provided to enable those having ordinary skill in the art to make and use the present invention according to the embodiments of the present invention.

Figure 1:
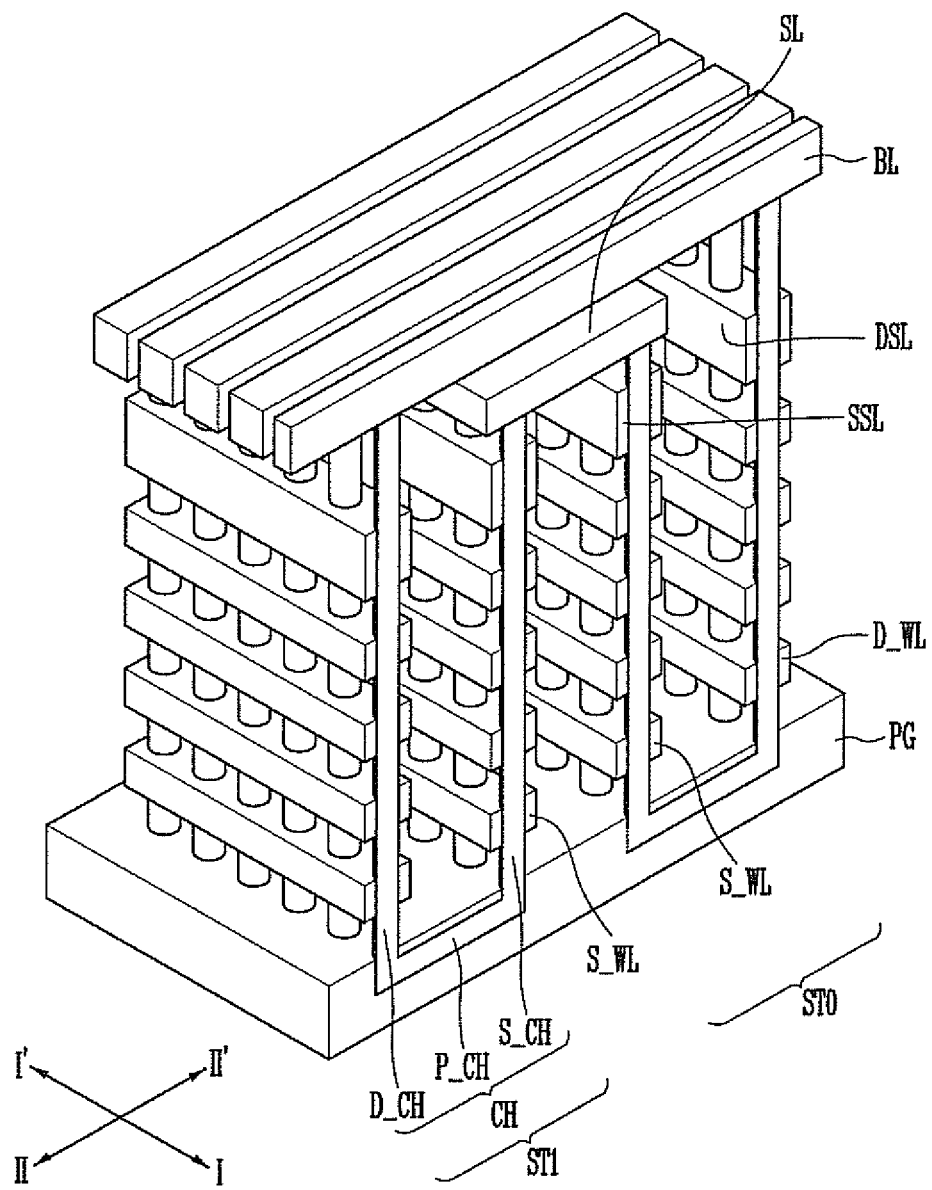
FIG. 1 is a perspective view illustrating a structure of the conventional three-dimensional (3D) non-volatile memory device.
Figure 2A:
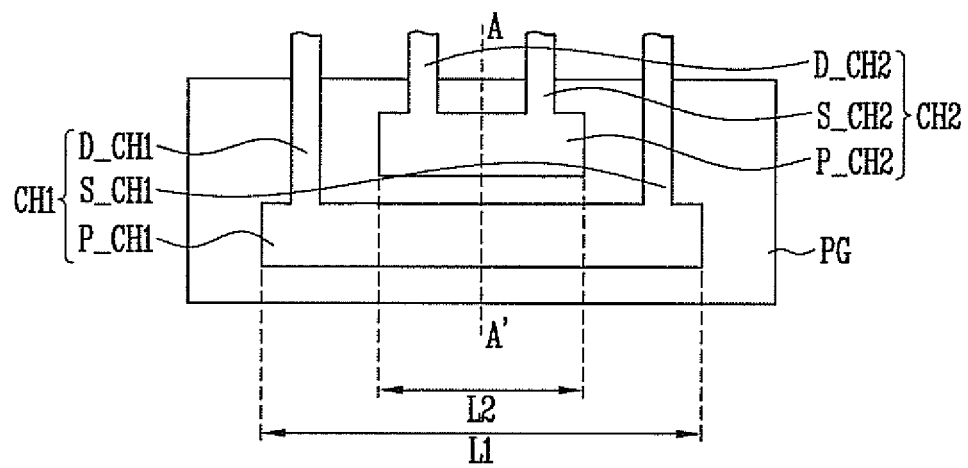
FIGS. 2A to 2C are sectional views illustrating a pipe gate region of a semiconductor device according to an embodiment of the present invention.
Figure 2B:
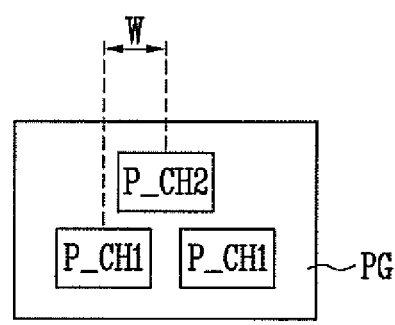
Figure 2C:
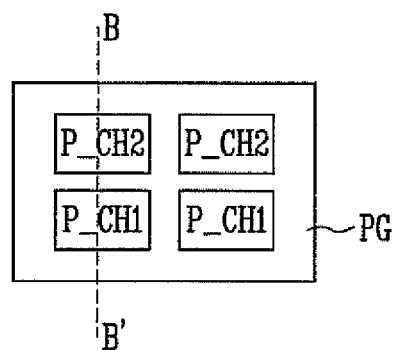

FIGS. 2A to 2C are sectional views illustrating a pipe gate region of a semiconductor device according to an embodiment of the present invention. Here, a pipe gate and a channel are mainly illustrated and other relevant layers are omitted. FIGS. 2B and 2C show A-A' sections of FIG. 2A.

As illustrated in FIG. 2A, a semiconductor device according to an embodiment of the present invention includes a pipe gate PG, a first channel layer CH1, and a second channel layer CH2. Here, the first channel layer CH1 includes a first pipe channel layer P-CH1 formed within the pipe gate PG and a pair of first source side channel layer S_CH1 and first drain side channel layer D_CH1 connected to the first pipe channel layer P_CH1. Also, the second channel layer CH2 includes a second pipe channel layer P_CH2 formed within the pipe gate PG and a pair of second source side channel layer S_CH2 and second drain side channel layer D_CH2 connected to the second pipe channel layer P_CH2.

The second channel layer CH2 is formed over the first channel layer CH1, and the first channel layer CH1 and the second channel layer CH2 positioned up and down constitute a pair of channel layers. The first channel layer CH1 and the second channel layer CH2 may be positioned in the same section or in different sections.

For example, as illustrated in FIG. 2B, when the first channel layer CH1 and the second channel layer CH2 are positioned in different sections, the second pipe channel layer P_CH2 is positioned between the first pipe channels P_CH1 to overlap with portions thereof. Here, the first pipe channel layer P_CH1 and the second pipe channel layer P_CH2 may have the same length (L1=L2) or different lengths. Also, when the first pipe channel layer P_CH1 and the second pipe channel layer P_CH2 have different lengths, the first pipe channel layer P_CH1 may be longer (L1>L2) or shorter (L1<L2) than the second pipe channel layer P_CH2.

In another example, as illustrated in FIG. 2C, when the first channel layer CH1 and the second channel layer CH2 are positioned in the same section, the second pipe channel layer P_CH2 may be completely overlapped with the first pipe channel layer P_CH1. Here, the length L1 of the first pipe channel layer P_CH1 may have a value greater than the length L2 of the second pipe channel layer P_CH2 (L1>L2).

Meanwhile, in this drawing, the structure in which the two channels CH1 and CH2 are stacked is illustrated, but two or more channels may be stacked. For example, when three or more channels are stacked, some channels may be positioned in the same section while the other remaining channels may be positioned in different sections, or the entirety of the channels may be positioned in the same section or in different sections.

Also, in this drawing, in arranging the first channel layer CH1 and the second channel layer CH2 forming a pair, the source side channel layers S_CH1 and S_CH2 are arranged to neighbor to each other, and the drain side channel layers D_CH1 and D_CH2 are arranged to neighbor to each other, but the present invention is not limited thereto. For example, the source side channel layers S_CH1 and S_CH2 and the drain side channel layers D_CH1 and D_CH2 may be alternately arranged.

According to the foregoing structure, since the channels CH1 and CH2 are provided in a stacked manner, the degree of integration of the memory device may be further enhanced.

FIGS. 3A to 3D are sectional views illustrating processes of manufacturing a 3D non-volatile memory device according to an embodiment of the present invention.

Figure 3A:

As illustrated in FIG. 3A, a first conductive layer 30 for a first pipe gate is etched to form a first trench for a first pipe channel, and a first sacrificial layer 31 is subsequently formed within the first trench. Here, the first sacrificial layer 31 may be formed of a nitride layer, a titanium nitride (TiN) layer, or the like.

Figure 3B:
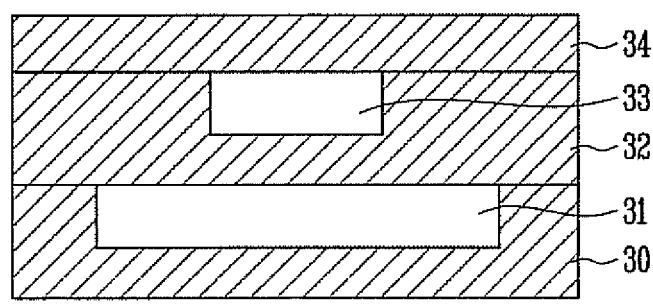

As illustrated in FIG. 3B, a second conductive layer 32 for a second pipe gate is formed on the first conductive layer 30 with the first sacrificial layer 31 formed therein. Subsequently, the second conductive layer 32 is etched to form a second trench for a second pipe channel, and a second sacrificial layer 33 is subsequently formed within the second trench. Here, the second sacrificial layer 33 may be formed of a nitride layer, a titanium nitride (TiN) layer, or the like.

Subsequently, a capping layer 34 may be formed on the second conductive layer 32. The capping layer 34 serve as a protective layer preventing a channel layer, a charge blocking layer, a charge trap layer, and a tunnel insulating layer from being damaged during a follow-up slit etching process. Also, when the capping layer 34 is formed as a conductive layer, since the capping layer 34 serves as a pipe gate together with the first and second conductive layers 30 and 32, the entire surface of the second pipe channel layer P_CH2 including the upper surface thereof is surrounded by the pipe gate, improving a cell current of the second channel layer CH2.

Figure 3C:
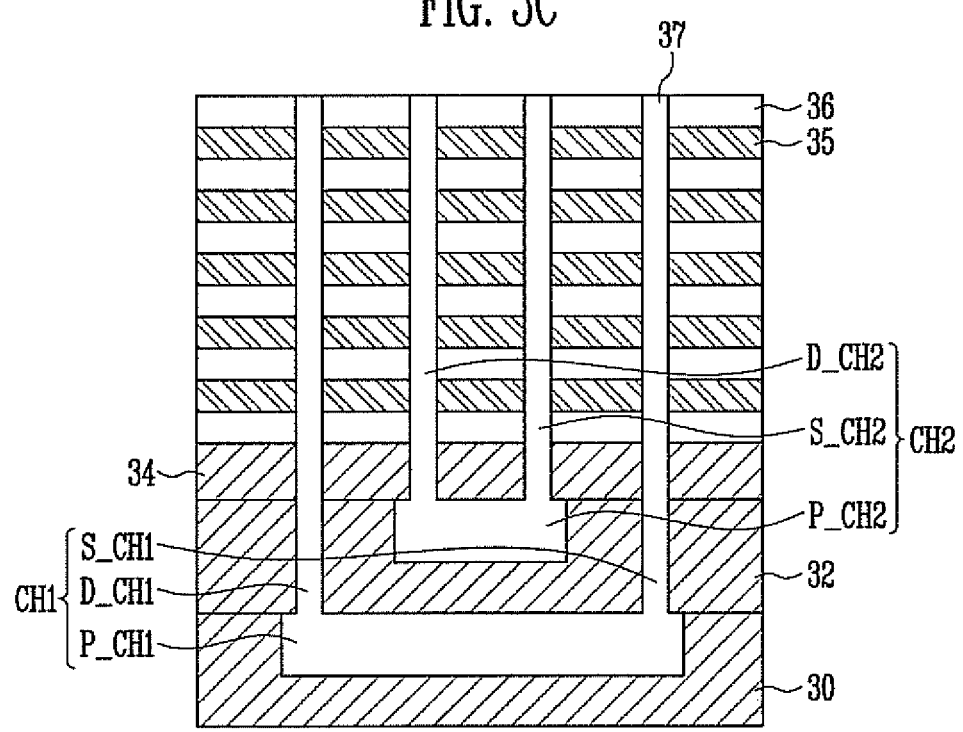

As illustrated in FIG. 3C, first material layers 35 and second material layers 36 are alternately formed on the capping layer 34.

The first material layers 35 are to form word lines, drain selection lines, or source selection lines in a follow-up process, and the second material layers 36 are to form interlayer insulating layers for separating the stacked word lines and the drain selection lines/source selection lines. Thus, the number of the stacked first material layers 35 and second material layers 36 is determined depending on the number of memory cells, drain selection gates, and source selection gates to be stacked.

A material of the first material layers 35 and the second material layers 36 is determined in consideration of the role of each layer and a manufacturing process. The first material layers 35 and the second material layers 36 are made of materials having a high etch selectivity. For example, the first metal layers 35 may be formed of a conductive layer or a sacrificial layer, and the second material layer 36 may be formed of an interlayer insulating layer or a sacrificial layer.

For example, the first material layer 35 may be formed of a conductive layer such as a polysilicon layer, or the like, and the second material layer 36 may be formed of an insulating layer such as an oxide layer, or the like. In another example, the first material layer 35 may be formed of a conductive layer such as a doped polysilicon layer, a doped amorphous silicon layer, or the like, and the second material layer 36 may be formed of a sacrificial layer such as an undoped polysilicon layer, an undoped amorphous silicon layer, or the like. In another example, the first material layer 35 may be formed of a sacrificial layer such as a nitride layer, or the like, and the second material layer 36 may be formed of an insulating layer such as an oxide layer, or the like.

Subsequently, the first material layers 35 and the second material layers 36 are etched to form holes for forming source side channel layers and drain side channel layers. The holes are formed such that a pair of holes is connected in each trench, and here, first channel holes connected to a first trench may be formed to have a depth deeper than that of second channel holes connected a second trench. The first channel holes and the second channel holes may be formed simultaneously or through separate processes. When the first channel holes and the second channel holes are formed through separate processes, an insulating layer is formed in the first formed holes, and the other remaining holes are subsequently formed.

Subsequently, the first sacrificial layer 31 exposed at the bottom of the first channel holes and the second sacrificial layer 33 exposed at the bottom of the second channel holes are removed. Accordingly, a first U-shaped trench including the first trench and a pair of first channel holes and a second U-shaped trench including the second trench and a pair of second channel holes are formed.

Subsequently, after a charge blocking layer, a charge trap layer, and a tunnel insulating layer (not shown) are formed on inner surfaces of the first U-shaped trench and the second U-shaped trench, a channel layer 37 is formed on the tunnel insulating layer. Accordingly, the first channel layer CH1 including a first pipe channel layer P_CH1 and a pair of first source side channel layer S_CH1 and first drain side channel layer D_CH1 and a second channel layer CH2 including a second pipe channel layer P_CH2 and a pair of second source side channel layer S_CH2 and second drain side channel layer D_CH2.

In this drawing, it is illustrated that the first channel layer CH1 and the second channel layer CH2 are formed to fully fill up their central regions, but a channel layer may be formed without filling up the central region and an insulating layer is buried in the open central region. Alternatively, the channel layer 37 may be formed such that the pipe channel layer P_CH is fully buried in the trench up to the central region thereof and the drain side channel layer D_CH and the source side channel layer S_CH have open central regions, in which an insulating layer may be buried.

As illustrated in FIG. 3D, the first material layers 35 and the second material layers 36 are etched to form first to fifth slits S1~S5.

The first slit S1 is positioned between a pair of second source side channel layer S_CH2 and second drain side channel layer D_CH2 constituting a single second channel layer CH2. The first slit S1 separates a source selection line and a drain selection line included in a single string while separating source side word lines and drain side word lines, and it may be formed to have a depth such that all the first material layers 35 are exposed.

The second slit S2 is positioned between first source side channel layers S_CH1 of the first channel layers CH1 that neighbor to each other in the second direction II-II'. The second slit S2 separates source selection lines and source side word lines of the neighboring first channel layers CH1, and it is formed to have a depth such that all the first material layers 35 are exposed.

The third slit S3 is positioned between the first drain side channel layers D_CH1 of the first channel layers CH1 that neighbor to each other in the second direction II-II'. The third slit S3 is positioned between the first drain side channel layers D_CH1 of neighboring first channel layers CH1. The third slit S3, separating the drain selection lines and the drain side word lines of the first channel layers CH1, may be formed to have a depth such that all the first material layers 35 are exposed.

The fourth slit S4 is positioned between the first drain side channel layer D_CH1 and the second drain side channel layer D_CH2 of the first channel layer CH1 and the second channel layer CH2 forming a pair. The fourth slit S4 separates the drain selection lines of the first and second channel layers CH1 and CH2 forming a pair. Thus, the fourth slit S4 is formed to have a depth such that the drain selection lines are separated, e.g., a layer of the first material layer 35 is exposed. However, the fourth slit S4 may be formed to have a depth such that all the first material layers 35 are exposed, as necessary, and in such a case, the fourth slit S4 separates the drain selection lines and drain side word lines of the first and second channel layers CH1 and CH2 forming a pair.

The fifth slit S5 is positioned between the first source side channel layer S_CH1 and a second source side channel layer S_CH2 of the first channel layer CH1 and the second channel layer CH2 forming a pair. The fifth slit S5 separates source selection lines of the first and second channel layers CH1 and CH2 forming a pair. Thus, the fifth slit S5 is formed to have a depth such that the source selection lines are separated, e.g., such that at least one of the first material layer 35 is exposed. However, the fifth slit S5 may be formed to have a depth such that all the first material layers 35 are exposed, as necessary, and in such a case, the fifth slit S5 separates the source selection lines and the source side word lines of the first and second channels CH1 and CH2 forming a pair.

The non-volatile memory device may include all the first to fifth slits S1~S5 or only some of them.

Subsequently, although not shown, an insulating layer is buried within the first to fifth slits S1~S5. However, an additional process may be performed before an insulating layer is buried, depending on a material of the first material layer 35 and the second material layer 36.

For example, when the first material layer 35 is formed as a conductive layer and the second material layer 36 is formed as an insulating layer, an insulating layer (not shown) is buried within the first to fifth slits S1~S5. Accordingly, the process of manufacturing a memory cell is completed.

In another example, when the first material layer 35 is formed as a conductive layer and the second material layer 36 is formed as a sacrificial layer, the second material layers 36 exposed in the first to fifth slits S1~S5 are removed. Subsequently, an insulating layer is buried in the regions from which the second material layers 36 were removed and within the first to fifth slits S1~S5. Accordingly, the process of manufacturing a memory cell is completed.

In another example, when the first material layer 35 is formed as a sacrificial layer and the second material layer 36 is formed as an insulating layer, the first material layers 35 exposed to the first to fifth slits S1~S5 are removed. Subsequently, a conductive layer is buried in the regions from which the first material layers 35 were removed to form word lines or drain selection lines/source selection lines. Here, before the conductive layer is buried, a charge blocking layer may be additionally formed along the whole surface of the regions from which the first material layers 35 were removed, and the additionally formed charge blocking layer may be formed of an aluminum oxide layer ($Al_2O_3$).

Subsequently, an insulating layer is buried within the first to fifth slits S1~S5. Accordingly, the process of manufacturing a memory cell is completed.

According to the foregoing manufacturing process, the source side word lines S_WL are stacked, wherein the source side word lines S_WL surround the first and second source side channel layers S_CH1 and S_CH2 of the first channel layer CH1 and the second channel layer CH2 forming a pair. Also, the drain side word lines D_WL are stacked, wherein the drain side word lines D_WL surround the first and second drain side channel layers D_CH1 and D_CH2 of the first channel layer CH1 and the second channel layer CH2 forming a pair. Thus, in comparison to the conventional word lines, the width of the pattern is increased, and accordingly, although the first to fifth slits S1-S5 are formed, tilting of the staked word lines does not occur.

Figure 4A:
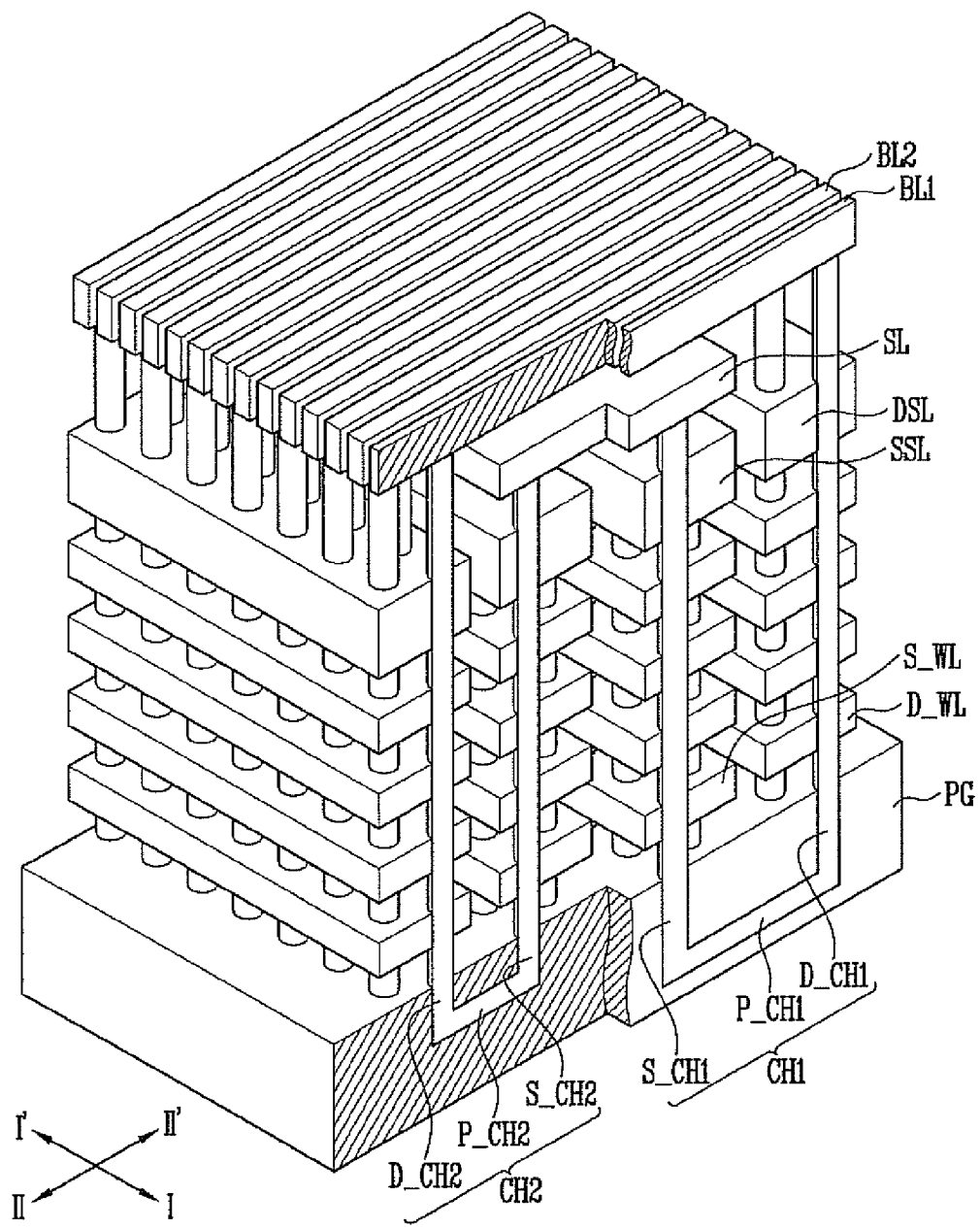
FIGS. 4A to 4C are views illustrating a structure of a 3D non-volatile memory device according to a first embodiment of the present invention.
Figure 4B:
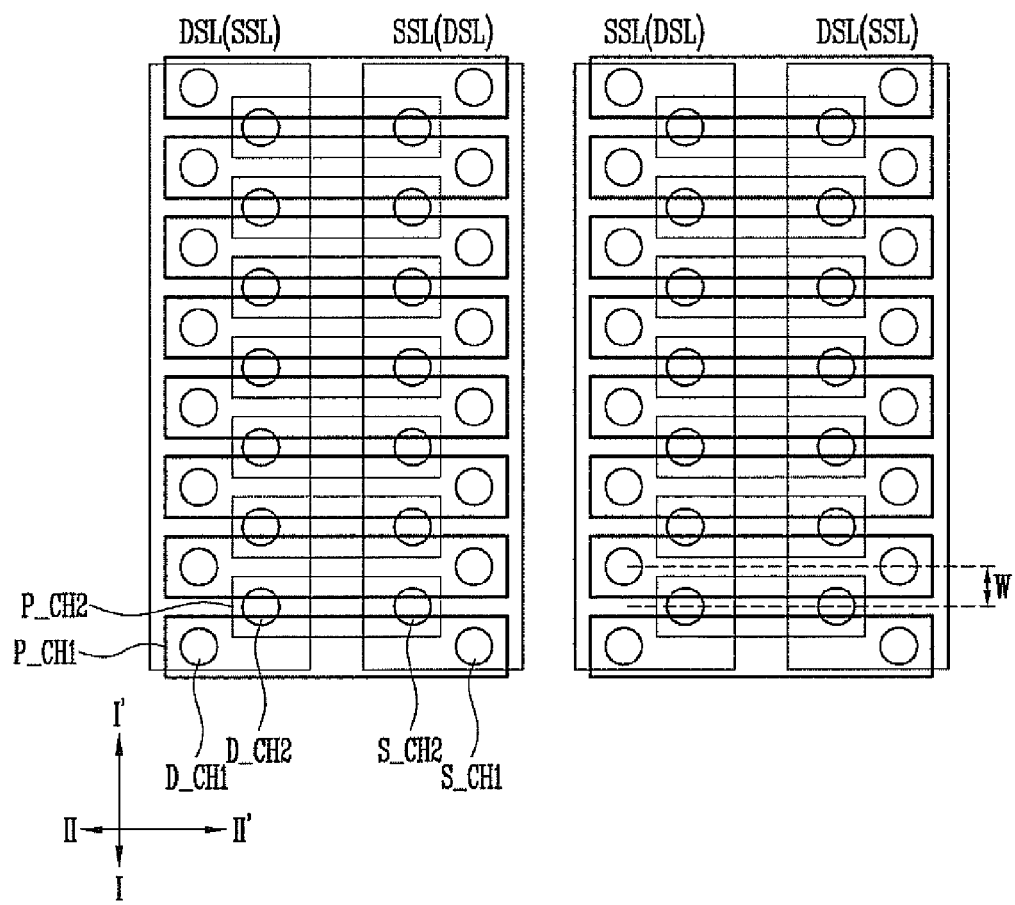
Figure 4C:
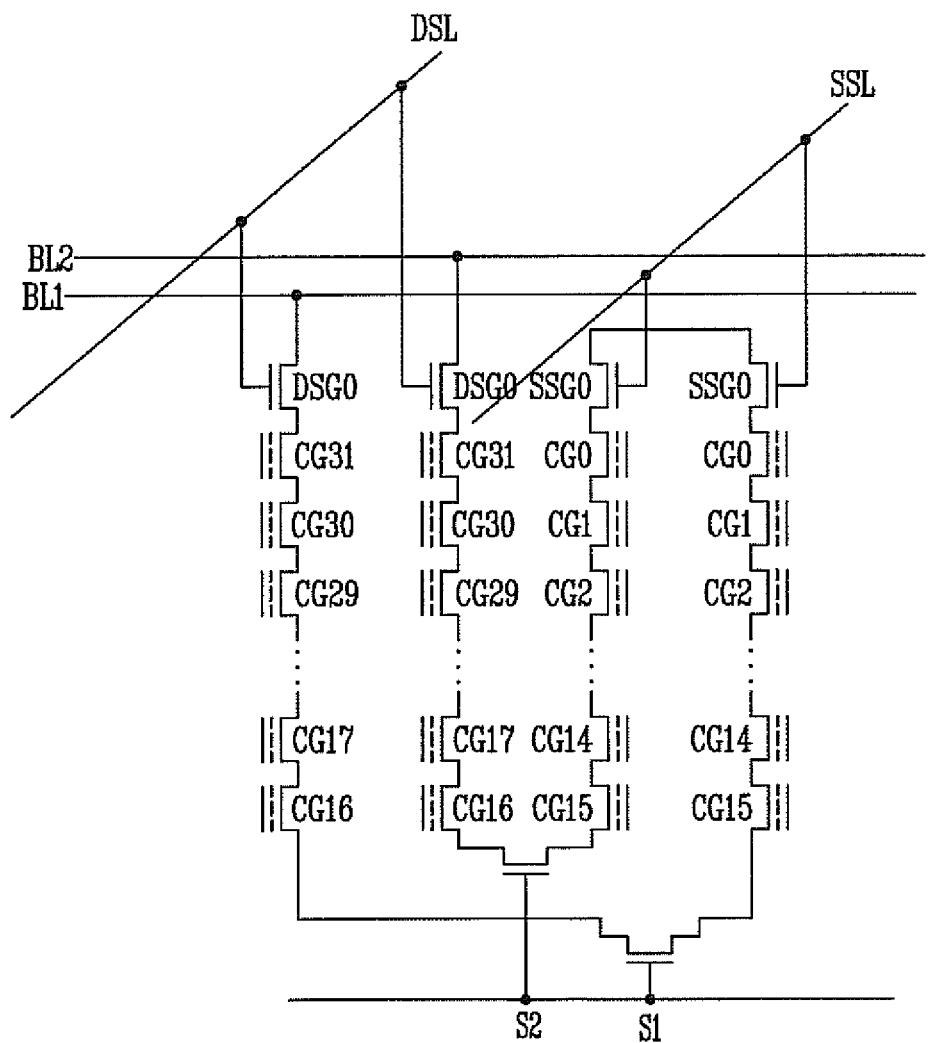

FIGS. 4A to 4C are views illustrating a structure of a 3D non-volatile memory device according to a first embodiment of the present invention.

FIG. 4A is a perspective view of a 3D non-volatile memory device according to a first embodiment of the present invention. As illustrated, the 3D non-volatile memory device includes a pipe gate PG, first channel layers CH1, and the second channel layers CH2. Also, the memory device includes the first to third slits S1~S3 as described above with reference to FIG. 3D.

The first channel layers CH1 include a first pipe channel layer P_CH1 buried in the pipe gate PG and a pair of first source side channel layer S_CH1 and first drain side channel layer D_CH1 connected to the first pipe channel layer P_CH1. Also, the second channel layers CH2 include a second pipe channel layer P_CH2 buried in the pipe gate PG and a pair of second source side channel layer S_CH2 and second drain side channel layer D_CH2 connected to the second pipe channel layer P_CH2.

Source side word lines S_WL and drain side word lines D_WL extending in the first direction I-I' are stacked over the pipe gate PG and arranged in parallel with each other. Here, the source side word lines S_WL enclose/surround the first source side channel layers S_CH1 of the first channel layers CH1 and the second source side channel layers S_CH2 of the second channel layers CH2. Also, the drain side word lines D_WL enclose the first drain side channel layers D_CH1 of the first channel layers CH1 and the second drain side channel layers D_CH2 of the second channel layers CH2.

Source selection lines SSL extending in the first direction I-I' are formed over the source side word lines S_WL and arranged in parallel with each other. Drain selection lines DSL extending in the first direction I-I' are formed over the drain side word line D_WL and arranged in parallel with each other. Here, the source selection lines SSL and the drain selection lines DSL are stacked or formed in at least one level. Furthermore, the source selection lines SSL enclose the first source side channel layers S_CH1 of the first channel layers CH1 and the second source side channel layers S_CH2 of the second channel layers CH2. Also, the drain selection lines DSL enclose the first drain side channel layers D_CH1 of the first channel layers CH1 and the second drain side channel layers D_CH2 of the second channel layers CH2.

Source lines SL extending in the first direction I-I' are formed over the source selection lines SSL. The source line SL is connected to the first source side channel layer S_CH1 and the second source side channel layer S_CH2 of the first channel layer CH1 and the second channel layer CH2 forming a pair.

Also, bit lines BL extending in the second direction II-II' are formed over the source lines SL and arranged in parallel with each other. Here, the first channel layer CH1 and the second channel layer CH2 forming a pair are connected to different bit lines BL. The first drain side channel layers D_CH1 of the first channel layers CH1 are connected to the first bit line BL1, and the second drain side channel layers D_CH2 of the second channel layers CH2 are connected to the second bit line BL2.

FIG. 4B is a layout view of the 3D non-volatile memory device according to the first embodiment of the present invention. As illustrated, the first pipe channel layer P-CH1 and the second pipe channel layer P_CH2 are arranged with a width 'W' between their centers. For example, the second pipe channel layer P_CH2 may be positioned between the first pipe channel layers P_CH1, that neighbor to each other in the first direction I-I', to overlap with portions thereof. In this manner, since the first pipe channel layers P_CH1 and the second pipe channel layers P_CH2 are arranged in a staggered manner, the degree of integration of the memory device may be enhanced.

Also, since the word lines and the selection lines to which the first channel layer CH1 and the second channel layer CH2 are connected are formed as a single pattern, the width of the word lines and the selection lines may be increased in comparison to the related art, preventing an occurrence of a phenomenon that the stacked patterns incline. In particular, according to the structure, although the width of the word lines and the selection lines is increased, neighboring memory blocks do not share the drain selection lines DSL, the 3D non-volatile memory device operates without altering a driving algorithm.

Meanwhile, in this drawing, it is illustrated that the source selection lines SSL and the drain selection lines DSL of the channel layers CH are arranged alternately two by two (i.e., in a manner of DSL/SSL/SSL/DSL), but the source selection lines SSL and the drain selection lines DSL are arranged alternately one by one (i.e., in a manner of DSL/SSL/DSL/SSL).

FIG. 4C is a circuit diagram illustrating a cell array of the 3D non-volatile memory device according to the first embodiment of the present invention. Here, however, only a first string and a second string forming a pair are illustrated for the description purposes.

As illustrated, memory cells stacked along the first channel layer CH1, at least one source selection gate, and at least one drain selection gate constitute the first string S1, and memory cells stacked along the second channel layer CH2, at least one source selection gate, and at least one drain selection gate constitute the second string S2.

Here, the first string S1 and the second string S2 are connected to the same drain selection line DSL and the same source selection line SSL. Also, the first string S1 is connected to the first bit line BL1 and the second string STR is connected to the second bit line BL2.

Figure 5A:
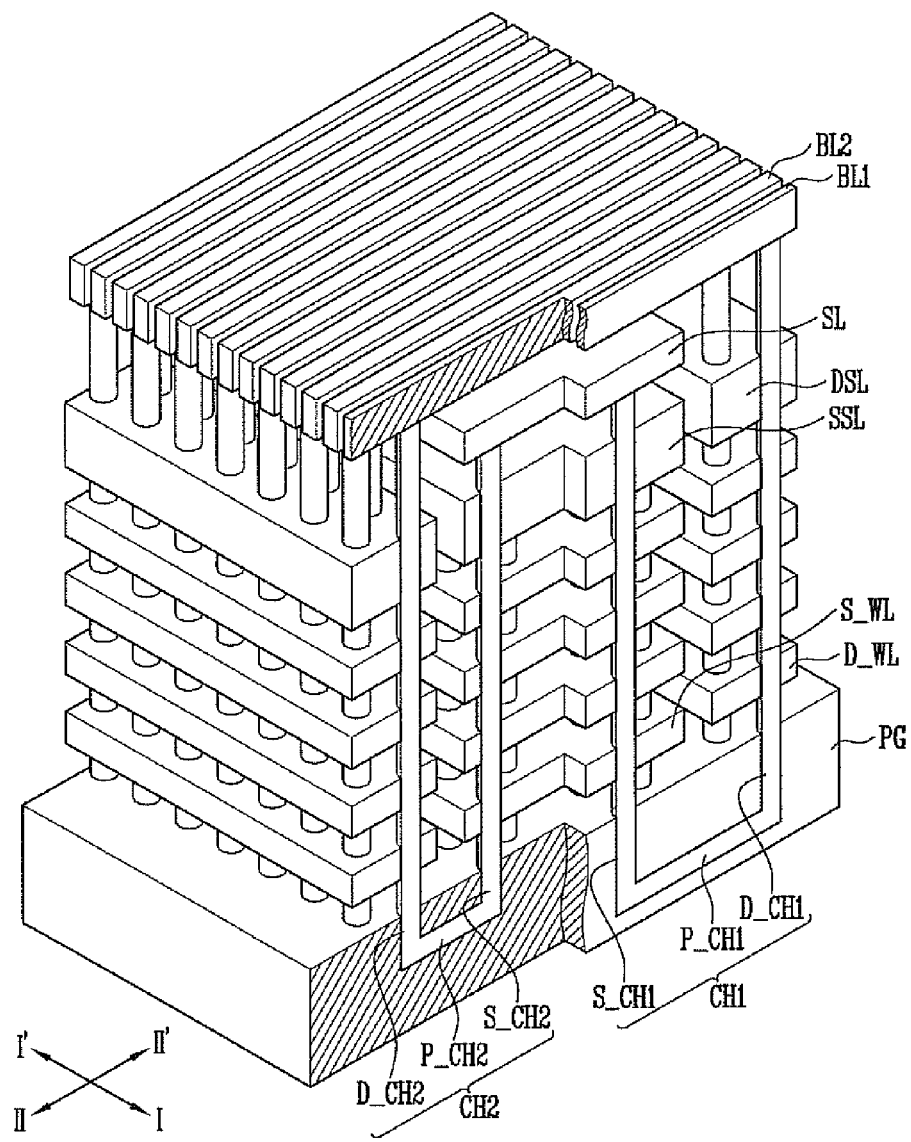
FIGS. 5A and 5B are views illustrating a structure of a 3D non-volatile memory device according to a second embodiment of the present invention.
Figure 5B:
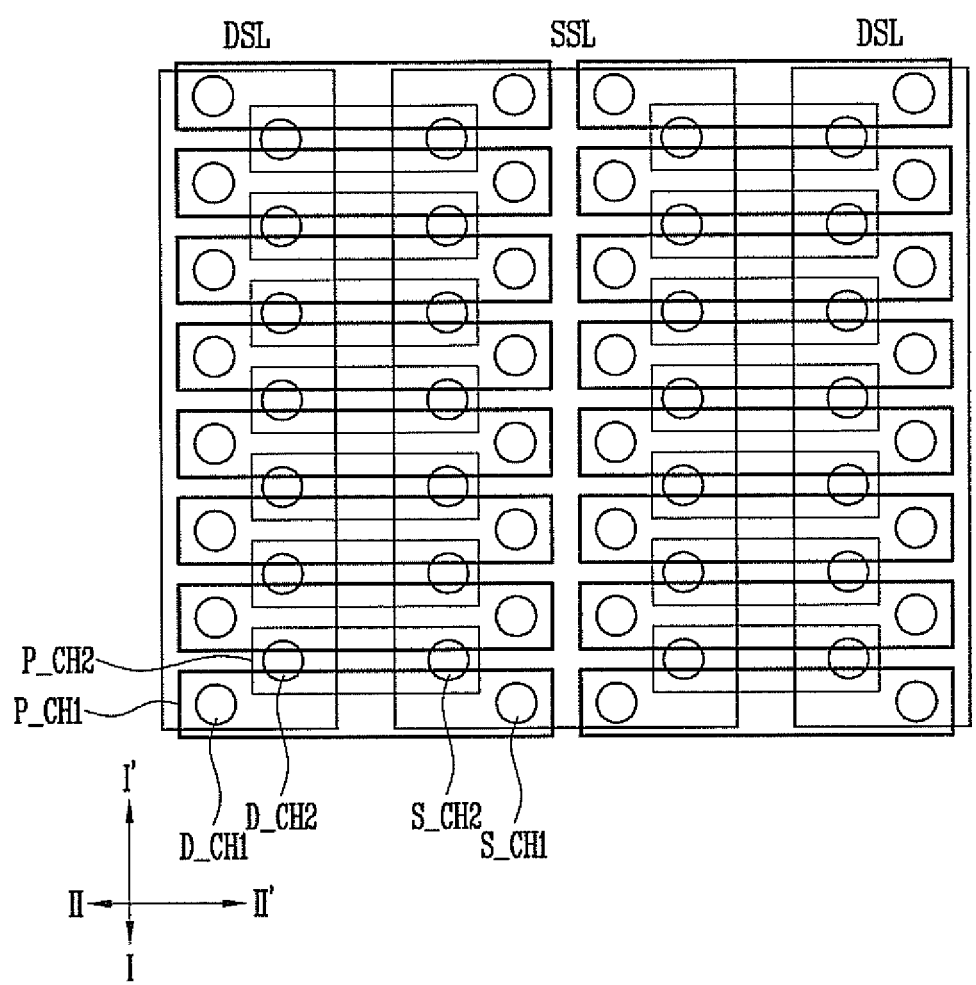

FIGS. 5A and 5B are views illustrating a structure of a 3D non-volatile memory device according to a second embodiment of the present invention.

FIG. 5A is a perspective view of a 3D non-volatile memory device according to a second embodiment of the present invention. As illustrated, the memory device includes the first and third slits S1 and S3 as described above with reference to FIG. 3D. Thus, the neighboring source selection lines SSL are connected to each other, and neighboring source side word lines S_WL are connected. Namely, the source selection lines SSL that are positioned on the same layer and neighbor to each other in the second direction II-II' are connected/formed as a single pattern, and the source side word lines S_WL that are positioned on the same layer and neighbor to each other in the second direction II-II' are connected as a single pattern. The other structure is the same as that of the first embodiment described above.

FIG. 5B is a layout view of the 3D non-volatile memory device according to the second embodiment of the present invention. As illustrated, the source selection lines SSL that neighbor to each other in the second direction II-II' are connected as a single pattern.

According to the structure, the width of the source side word lines S_WL and the source selection lines SSL may be further increased. Thus, the phenomenon that the stacked source side word lines S_WL and at least one of source selection line SSL incline may be further effectively prevented from occurring.

Figure 6A:
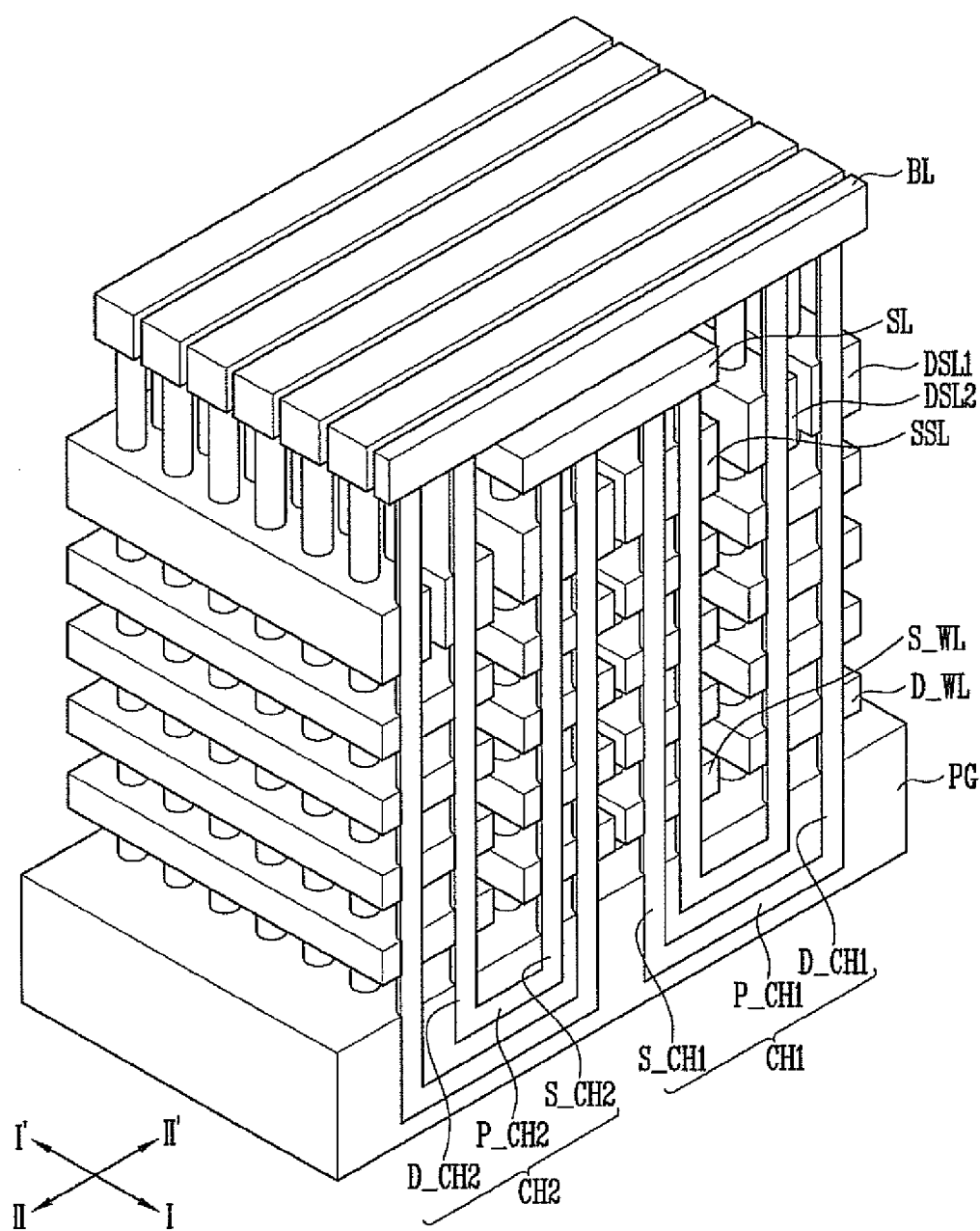
FIGS. 6A to 6C are views illustrating a structure of a 3D non-volatile memory device according to a third embodiment of the present invention.
Figure 6B:
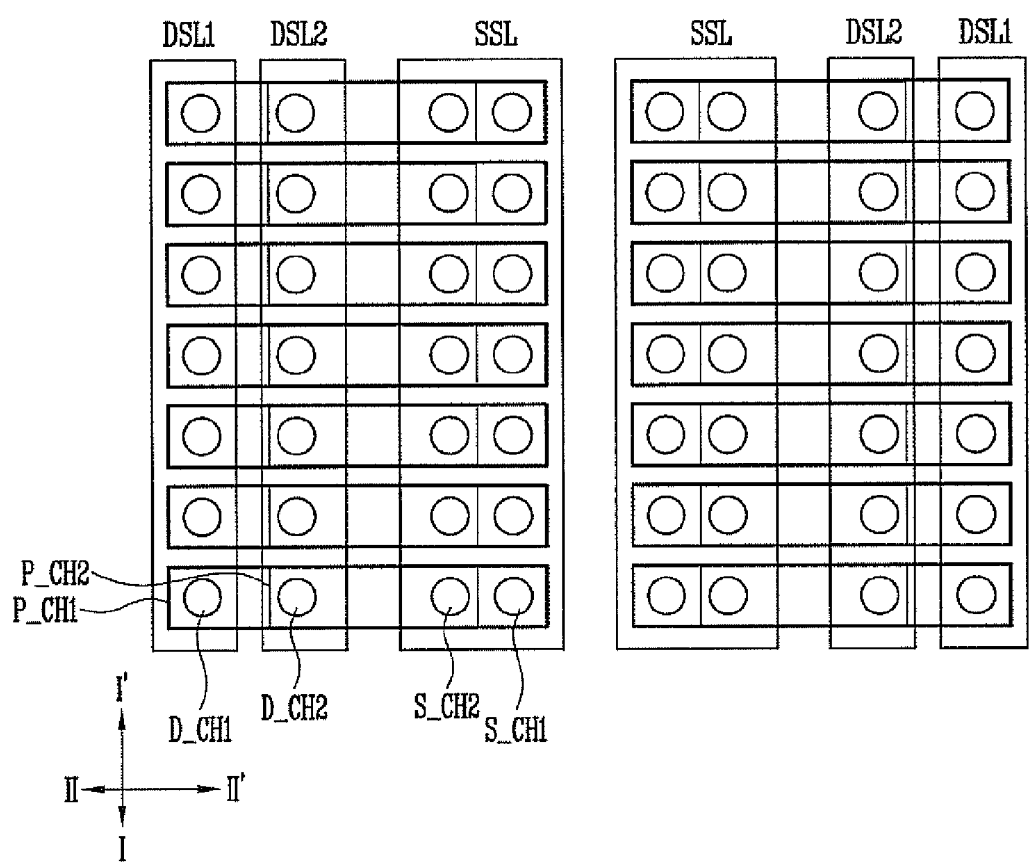
Figure 6C:
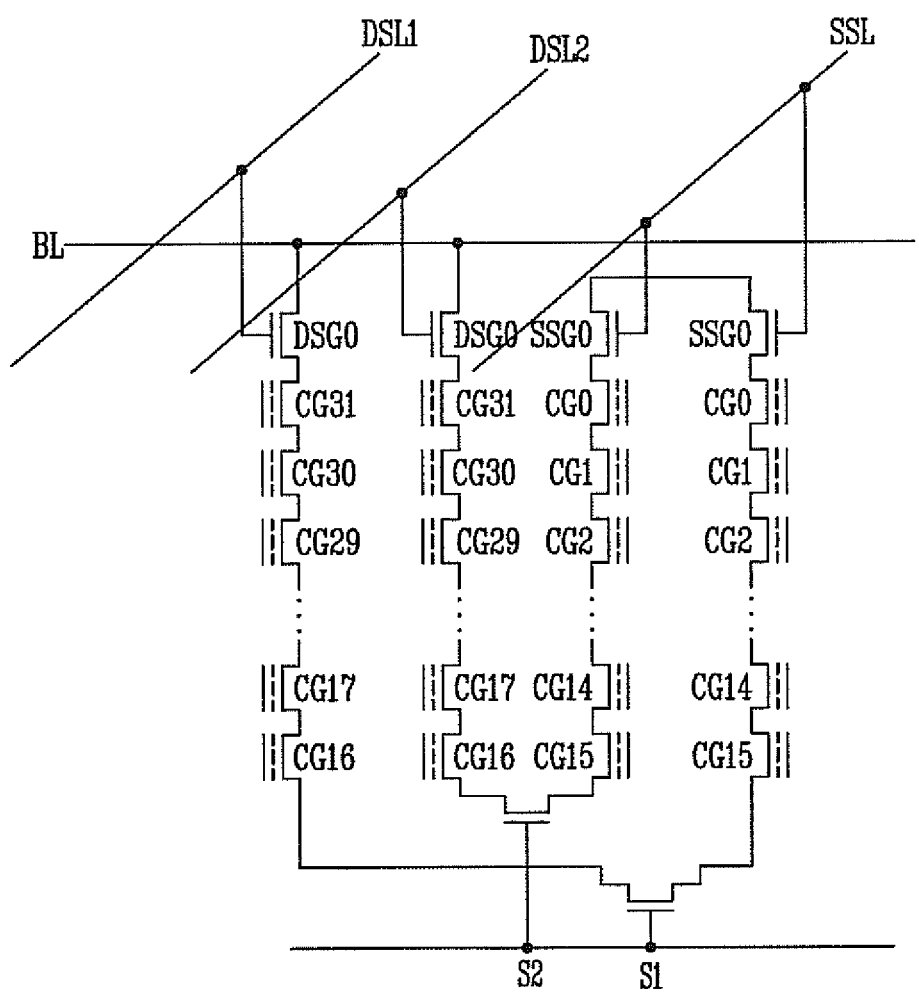

FIGS. 6A to 6C are views illustrating a structure of a 3D non-volatile memory device according to a third embodiment of the present invention.

FIG. 6A is a perspective view of a 3D non-volatile memory device according to a third embodiment of the present invention. As illustrated, the 3D non-volatile memory device includes a pipe gate PG, first channel layers CH1, and the second channel layers CH2. Also, the memory device includes the first to fourth slits S1~S4 as described above with reference to FIG. 3D.

Source side word lines S_WL and drain side word lines D_WL extending in the first direction I-I' are stacked over the pipe gate PG and arranged in parallel with each other. Here, the source side word lines S_WL enclose the first source side channel layers S_CH1 of the first channel layers CH1 and the second source side channel layers S_CH2 of the second channel layers CH2. Also, the drain side word lines D_WL enclose the first drain side channel layers D_CH1 of the first channel layers CH1 and the second drain side channel layers D_CH2 of the second channel layers CH2.

At least one of source selection lines SSL and at least one of drain selection lines DSL extending in the first direction I-I' are formed over the source side word lines S_WL and the drain side word lines D_WL. Here, the source selection lines SSL enclose the first source side channel layers S_CH1 of the first channel layers CH1 and the second source side channel layers S_CH2 of the second channel layers CH2. Also, the drain selection lines DSL includes the first drain selection lines DSL1 enclosing the first drain side channel layers D_CH1 of the first channel layers CH1 and the second drain selection lines DSL2 enclosing the second drain side channel layers D_CH2 of the second channel layers CH2.

For reference, the drain side word lines D_WL may be formed to have the same pattern as that of the drain selection lines DSL. Namely, the fourth slit S4 as described above with reference to FIG. 3D may be formed to have a depth such that all the first material layers are exposed. In such a case, the drain side word lines D_WL are patterned as first and second drain side word lines. Here, the first drain side word lines enclose the first drain side channel layer D_CH1 of the first channel layers CH1, and the second drain side word lines enclose the second drain side channel layer D_CH2 of the second channel layers CH2.

Source lines SL extending in the first direction I-I' are formed over the source selection lines SSL and arranged in parallel with each other. Also, bit lines BL extending in the second direction II-II' are formed over the source lines SL and arranged in parallel with each other. Here, the first channel layer CH1 and the second channel layer CH2 forming a pair are connected to the same bit line BL.

FIG. 6B is a layout view of the 3D non-volatile memory device according to the third embodiment of the present invention. As illustrated, the first pipe channel layer P_CH1 and the second pipe channel layer P_CH2 are arranged such that the centers thereof are in the same line B-B' as illustrated in FIG. 2C. In this manner, since the first channel layer CH2 and the second channel layer CH2 are arranged in a completely folded manner, the degree of integration of the memory device may be enhanced.

FIG. 5C is a circuit diagram illustrating a cell array of the 3D non-volatile memory device according to the third embodiment of the present invention. Here, however, only a first string and a second string forming a pair are illustrated for the description purposes.

As illustrated, the first string S1 and the second string S2 are connected to the same source selection line SSL and the same bit line BL. Also, the first string S1 is connected to the first drain selection line DSL1 and the second string S2 is connected to the second drain selection line DSL2.

Figure 7A:
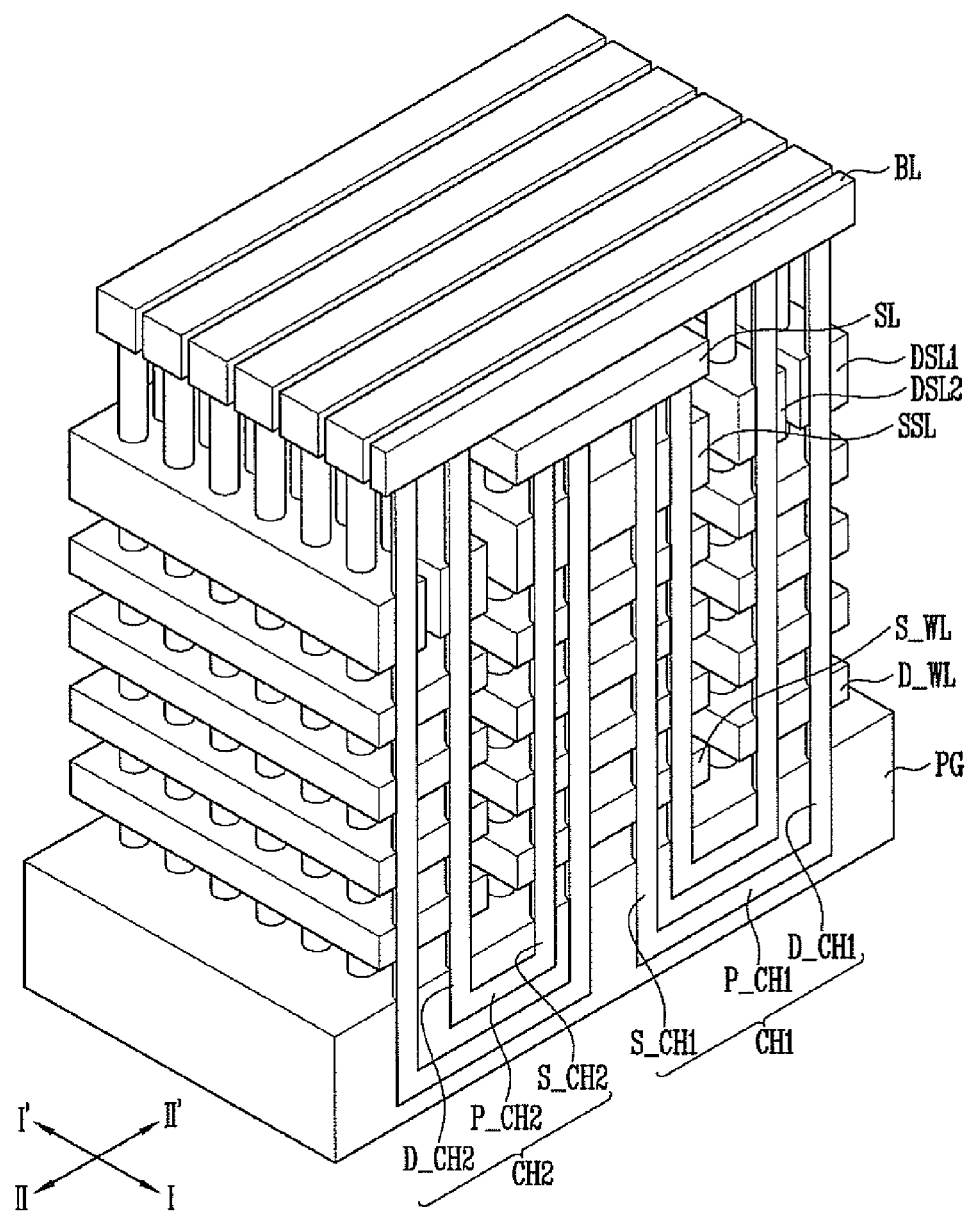
FIGS. 7A and 7B are views illustrating a structure of a 3D non-volatile memory device according to a fourth embodiment of the present invention.
Figure 7B:
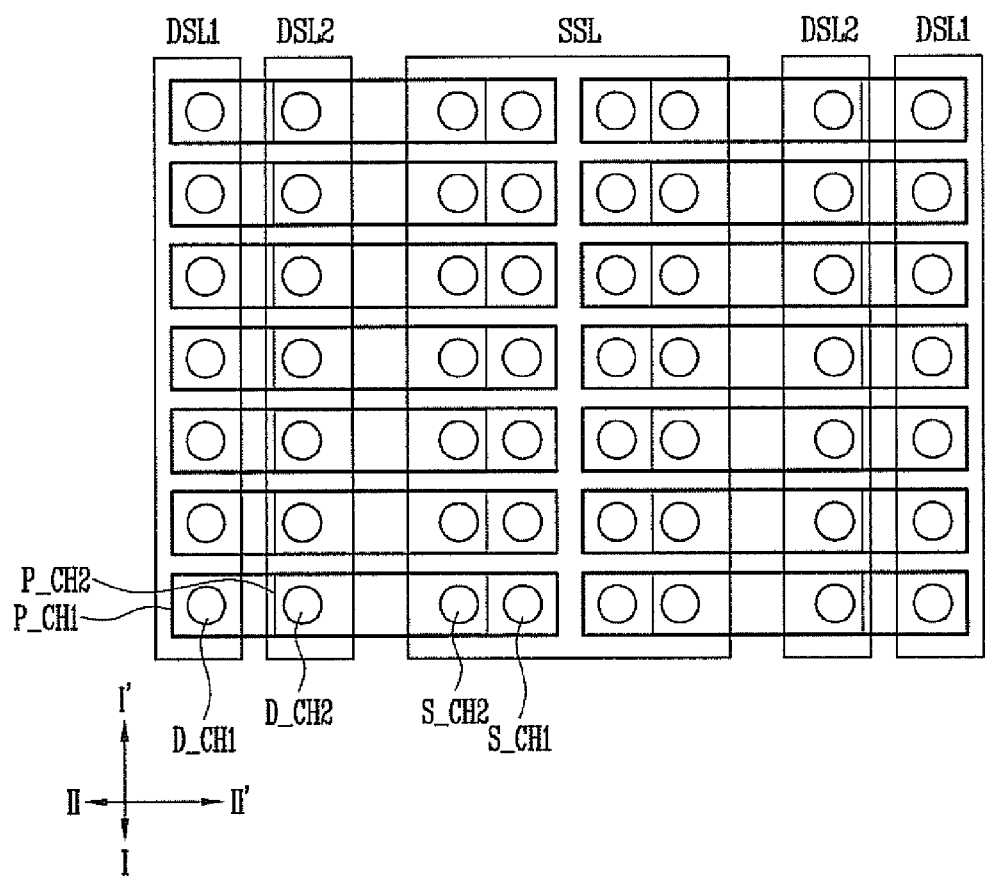

FIGS. 7A and 7B are views illustrating a structure of a 3D non-volatile memory device according to a fourth embodiment of the present invention.

FIG. 7A is a perspective view of a 3D non-volatile memory device according to the fourth embodiment of the present invention. As illustrated, the memory device includes the first, third, and fourth slits S1, S3, and S4 as described above with reference to FIG. 3D. Thus, the neighboring source selection lines SSL are connected to each other, and neighboring source side word lines S_WL are connected. Namely, the source selection lines SSL that are positioned on the same layer and neighbor to each other in the second direction II-II' are connected as a single pattern, and the source side word lines S_WL that are positioned on the same layer and neighbor to each other in the second direction II-II' are connected as a single pattern. The other structure is the same as that of the third embodiment described above.

FIG. 7B is a layout view of the 3D non-volatile memory device according to the fourth embodiment of the present invention. As illustrated, the source selection lines SSL that neighbor to each other in the second direction II-II' are connected as a single pattern.

Figure 8A:
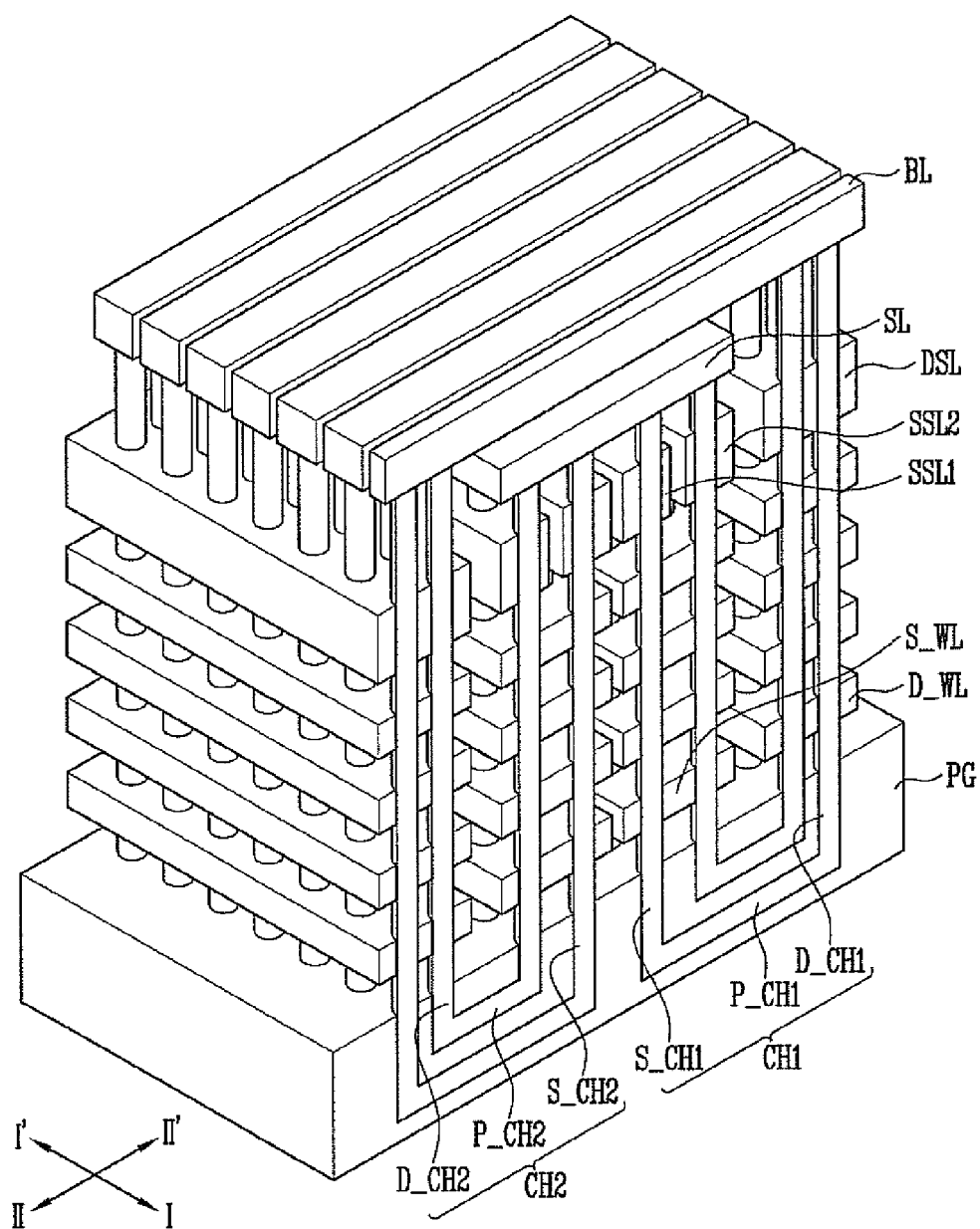
FIGS. 8A to 8C are views illustrating a structure of a 3D non-volatile memory device according to a fifth embodiment of the present invention.
Figure 8B:
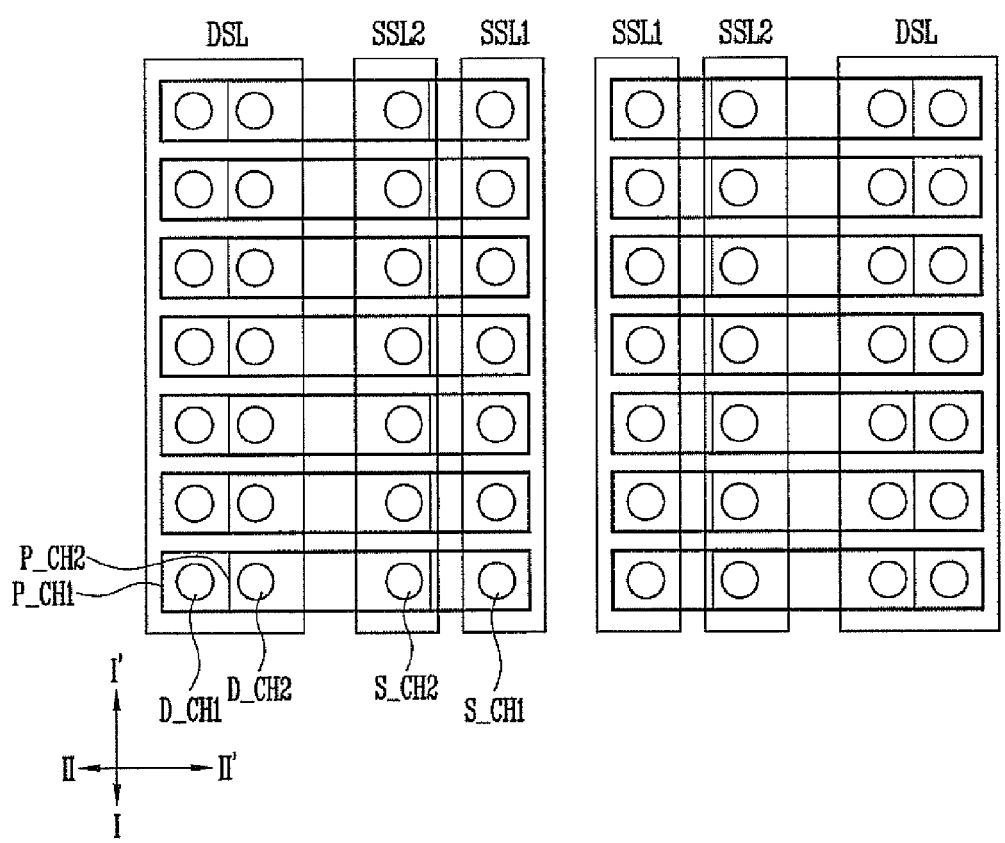
Figure 8C:
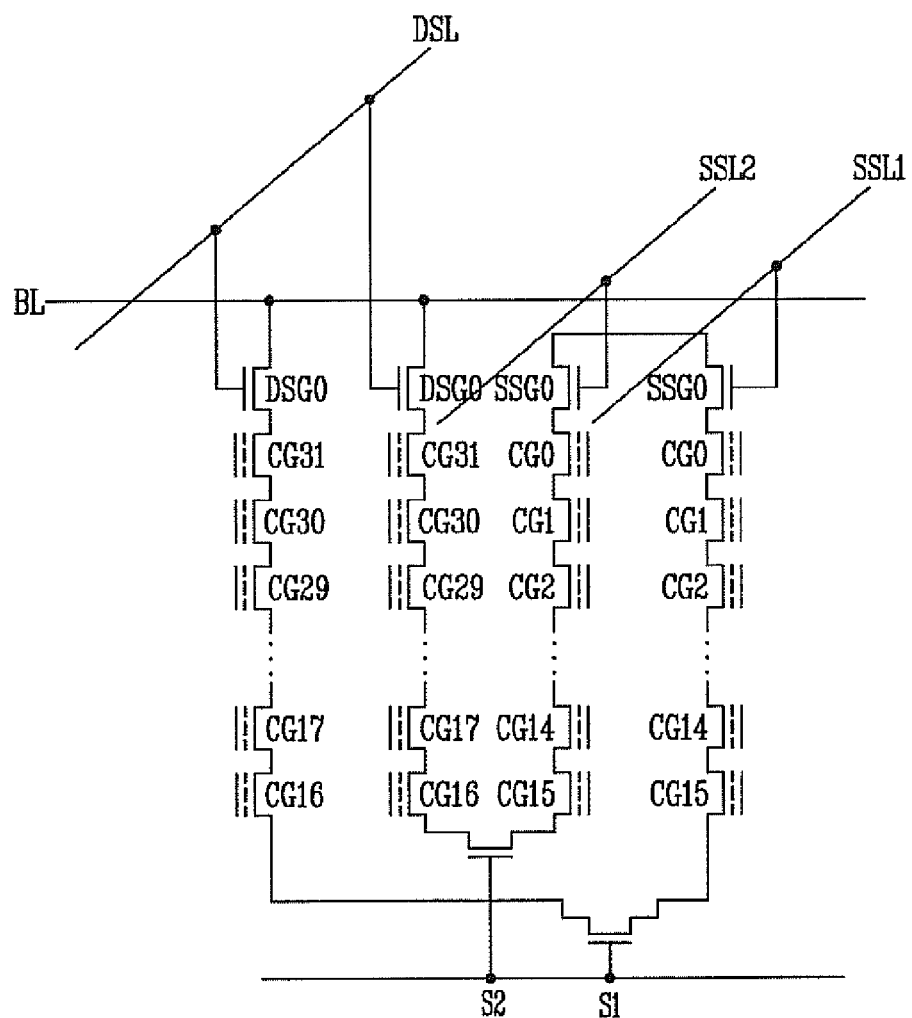

FIGS. 8A to 8C are views illustrating a structure of a 3D non-volatile memory device according to a fifth embodiment of the present invention.

FIG. 8A is a perspective view of a 3D non-volatile memory device according to a fifth embodiment of the present invention. As illustrated, the 3D non-volatile memory device includes a pipe gate PG, first channel layers CH1, and the second channel layers CH2. Also, the memory device includes the first, second, third, and fifth slits S1, S2, S3, and S5 as described above with reference to FIG. 3D.

Source side word lines S_WL and drain side word lines D_WL extending in the first direction I-I' are stacked over the pipe gate PG and arranged in parallel with each other. Here, the source side word lines S_WL enclose the first source side channel layers S_CH1 of the first channel layers CH1 and the second source side channel layers S_CH2 of the second channel layers CH2. Also, the drain side word lines D_WL enclose the first drain side channel layers D_CH1 of the first channel layers CH1 and the second drain side channel layers D_CH2 of the second channel layers CH2.

At least one of source selection lines SSL and at least one of drain selection lines DSL extending in the first direction I-I' are formed over the source side word lines S_WL and the drain side word lines D_WL. Here, the source selection lines SSL includes first source selection lines SSL1 enclosing the first source side channel layers S_CH1 of the first channel layers CH1 and second source selection lines SSL2 enclosing the second source side channel layers S_CH2 of the second channel layers CH2. Also, the drain selection lines DSL enclose the first drain side channel layers D_CH1 of the first channel layers CH1 and the second drain side channel layers D_CH2 of the second channel layers CH2.

For reference, the source side word lines S_WL may be formed to have the same pattern as that of the source selection lines SSL. In this case, the fifth slit S5 may be formed to have a depth such that all the first material layers are exposed. Thus, the first source side word lines S_WL1 enclose the first source side channel layers S_CH1 of the first channel layers CH1, and the second source side word lines S_WL2 enclose the second source side channel layers S_CH2 of the second channel layers CH2.

Source lines SL extending in the first direction I-I' are formed over the source selection lines SSL and arranged in parallel with each other. Also, bit lines BL extending in the second direction II-II' are formed over the source lines SL and arranged in parallel with each other. Here, the first channel layer CH1 and the second channel layer CH2 forming a pair are connected to the same bit line BL.

FIG. 8B is a layout view of the 3D non-volatile memory device according to the fifth embodiment of the present invention. As illustrated, the first pipe channel layer P-CH1 and the second pipe channel layer P_CH2 are arranged such that the centers thereof are in the same line B-B' as illustrated in FIG. 2C. In this manner, since the first channel layer CH2 and the second channel layer CH2 are arranged in a completely overlapped manner, the degree of integration of the memory device may be enhanced.

FIG. 8C is a circuit diagram illustrating a cell array of the 3D non-volatile memory device according to the fifth embodiment of the present invention. Here, however, only a first string and a second string forming a pair are illustrated for the description purposes.

As illustrated, the first string S1 and the second string S2 are connected to the same drain selection line DSL and the same bit line BL. Also, the first string S1 is connected to the first source selection line SSL1 and the second string S2 is connected to the second source selection line SSL2.

Figure 9A:
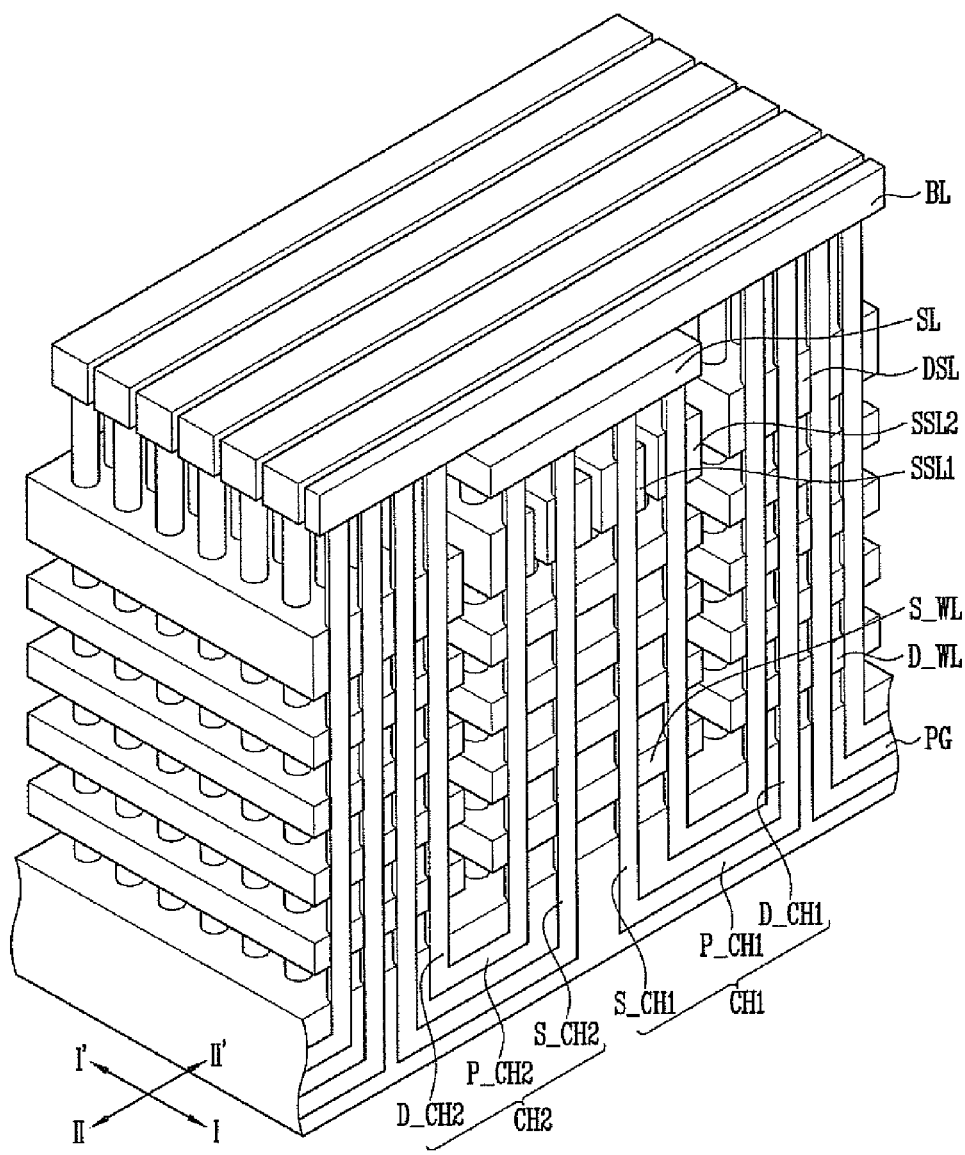
FIGS. 9A and 9B are views illustrating a structure of a 3D non-volatile memory device according to a sixth embodiment of the present invention.
Figure 9B:
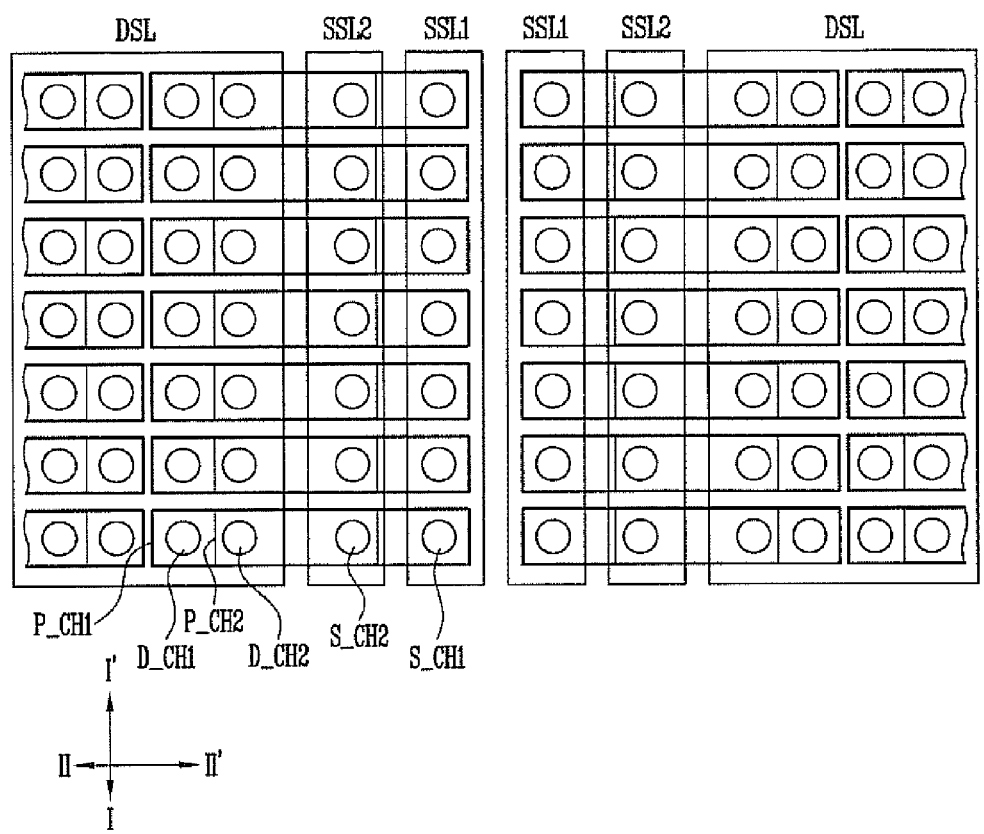

FIGS. 9A and 9B are views illustrating a structure of a 3D non-volatile memory device according to a sixth embodiment of the present invention.

FIG. 9A is a perspective view of a 3D non-volatile memory device according to the sixth embodiment of the present invention. As illustrated, the memory device includes the first, second, and fifth slits S1, S2, and S5 as described above with reference to FIG. 3D. Thus, the neighboring drain selection lines DSL are connected to each other, and neighboring drain side word lines D_WL are connected. Namely, the drain selection lines DSL that are positioned on the same layer and neighbor to each other in the second direction II-II' are connected as a single pattern, and the drain side word lines D_WL that are positioned on the same layer and neighbor to each other in the second direction II-II' are connected as a single pattern. The second slit S2 may be formed to have a depth such that at least one of the first material layers is exposed. The other structure is the same as that of the fifth embodiment described above.

FIG. 9B is a layout view of the 3D non-volatile memory device according to the sixth embodiment of the present invention. As illustrated, the drain selection lines DSL that neighbor to each other in the second direction II-II' are connected as a single pattern.

Figure 10:
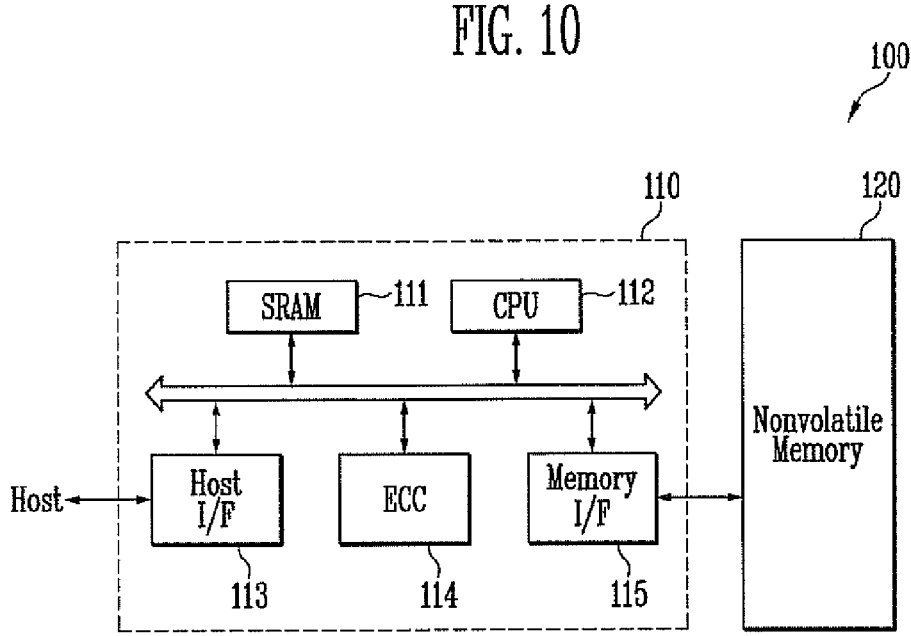
FIG. 10 is a view illustrating a configuration of a memory system according to an embodiment of the present invention.

FIG. 10 is a view illustrating a configuration of a memory system according to an embodiment of the present invention.

As illustrated in FIG. 10, a memory system 100 according to an embodiment of the present invention includes a non-volatile memory 120 and a memory controller 110.

The non-volatile memory 120 is formed to have the memory cell array as described above. Also, the non-volatile memory device 120 may be a multi-chip package including a plurality of flash memory chips.

The memory controller 110 is configured to control the non-volatile memory 120 and may include an SRAM 111, a CPU 112, a host interface (I/F) 113, an ECC 114, and a memory interface (I/F) 115. The SRAM 111 is used as an operation memory of the CPU 112. The CPU 112 performs a general control operation for the memory controller 110 to exchange data. The host I/F 113 includes a data exchange protocol of a host connected to the memory system 100. The ECC 114 detects and corrects an error included in data read from the non-volatile memory 120, and the memory I/F 115 performs interfacing with the non-volatile memory 120. Besides, the memory controller 110 may further include an RCM storing code data for interfacing with a host, and the like.

The memory system 100 having the foregoing configuration may be a memory card or a solid state disk (SSD) having a combination of the non-volatile memory 120 and the memory controller 110. For example, when the memory system 100 is an SSD, the memory controller 110 may communicate with the exterior (e.g., a host) through one of various interface protocols such as USB, MMC, PCI-E, SATA, PATA, SCSI, ESDI, IDE, and the like.

Figure 11:
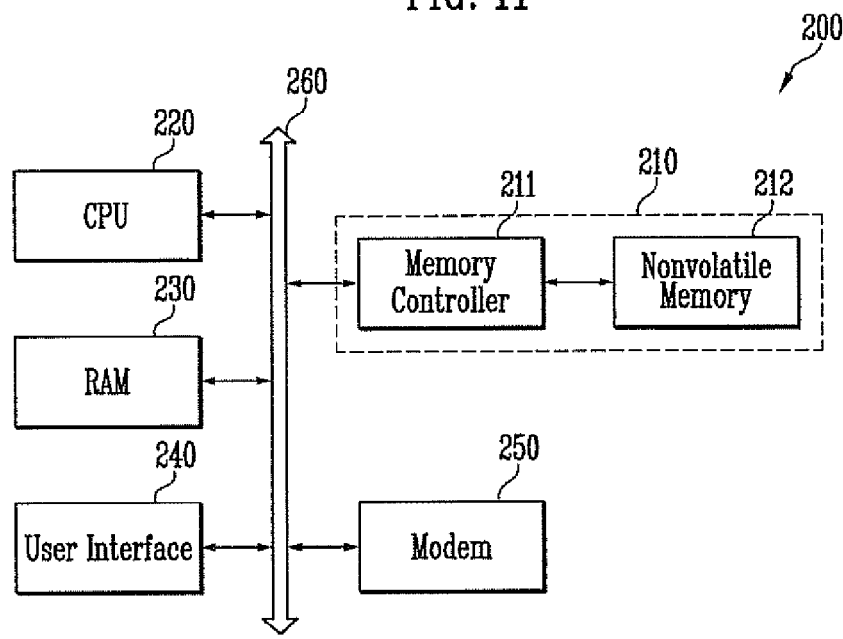
FIG. 11 is a view illustrating a configuration of a computing system according to an embodiment of the present invention.

FIG. 11 is a view illustrating a configuration of a computing system according to an embodiment of the present invention.

As illustrated in FIG. 11, a computing system 200 according to an embodiment of the present invention may include a CPU 220, a RAM 230, a user interface 240, a modem 250, and a memory system 210 electrically connected to a system bus 260. Also, when the computing system 200 is a mobile device, the mobile device may further include a battery for supplying an operating voltage thereto (or to the computing system 200), and it may further include an application chip set, a camera image processor, a mobile DRAM, or the like.

The memory system 210 may be comprised of the non-volatile memory 212 and the memory controller 211 as described above with reference to FIG. 10.

In accordance with the embodiments of the present invention, the degree of integration of the memory device may be enhanced by positioning the second channel layers on the first channel layers. Also, the stacked word lines may be prevented from tilting.

While the present invention has been shown and described in connection with the embodiments, it will be apparent to those skilled in the art that modifications and variations may be made without departing from the spirit and scope of the invention as defined by the appended claims.

What is claimed is:

1. A method for manufacturing a 3D non-volatile memory device, the method comprising:
   etching a first conductive layer to form first pipe trenches;

forming first sacrificial layers in the first pipe trenches;
forming a second conductive layer on the first conductive layer with the first sacrificial layers formed therein;
etching the second conductive layer to form second pipe trenches, wherein the second pipe trenches are separate from the first pipe trenches;
forming second sacrificial layers in the second pipe trenches; and
alternately forming first material layers and second material layers on the second conductive layer with the second sacrificial layers formed therein.

2. The method of claim 1, wherein the first and second pipe trenches are formed in a staggered manner.

3. The method of claim 1, further comprising:
forming a capping layer on the second conductive layer, after the forming of the second sacrificial layers.

4. The method of claim 1, further comprising:
etching the first material layers and the second material layers to form a pair of first channel holes connected to each of the first pipe trenches and a pair of second channel holes connected to each of the second pipe trenches, after the alternate forming of the first material layers and the second material layers;
removing the first sacrificial layers and the second sacrificial layers exposed by the pair of first channel holes and the pair of second channel holes to form first channel trenches and second channel trenches;
forming a memory layer along an inner surface of the first channel trenches and the second channel trenches; and
forming first channel layers each including a first pipe channel layer and a pair of first source side channel layer and first drain side channel layer connected to the first pipe channel layer, and second channel layers each including a second pipe channel layer and a pair of second source side channel layer and second drain side channel layer connected to the second pipe channel layer, on the memory layer.

5. The method of claim 4, further comprising:
etching the first material layers and the second material layers to form at least one first slit positioned between the pair of the second source side channel layer and the second drain side channel layer and at least one third slit positioned between neighboring first drain side channel layers of neighboring first channel layers, among the first channel layers, after the forming of the first channel layers and the second channel layers.

6. The method of claim 5, further comprising:
etching the first material layers and the second material layers to form at least one second slit positioned between neighboring first source side channel layers of neighboring first channel layers, among the first channel layers, after the forming of the first channel layers and the second channel layers.

7. The method of claim 5, further comprising:
etching the first material layers and the second material layers to form at least one fourth slit positioned between the first drain side channel layer and the second drain side channel layers, after the forming of the first channel layers and the second channel layers.

8. The method of claim 7, wherein the fourth slit is formed to separate first material layers for drain selection lines or for drain selection lines and drain side word lines.

9. The method of claim 5, further comprising:
etching the first material layers and the second material layers to form at least one fifth slit positioned between the first source side channel layer and the second source side channel layer, after the forming of the first channel layers and the second channel layers.

10. The method of claim 9, wherein the fifth slit is formed to separate the first material layers for source selection lines or for source selection lines and source side word lines.

11. A method for manufacturing a 3D non-volatile memory device, the method comprising:
etching a first conductive layer to form first pipe trenches;
forming first sacrificial layers in the first pipe trenches;
forming a second conductive layer on the first conductive layer with the first sacrificial layers formed therein:
etching the second conductive layer to form second pipe trenches:
forming second sacrificial layers in the second pipe trenches; and
alternately forming first material layers and second material layers on the second conductive layer with the second sacrificial layers formed therein,
wherein the second pipe trenches are formed to overlap with the respective first pipe trenches and have center lines thereof in the same line.

12. A method for manufacturing a 3D non-volatile memory device, the method comprising:
forming a first pipe trench in a first conductive layer;
forming a first sacrificial layer in the first pipe trench;
forming a second conductive layer on the first conductive layer with the first sacrificial layer formed therein;
forming a second pipe trench in the second conductive layer, wherein the second pipe trench is separate from the first pipe trench;
forming a second sacrificial layer in the second pipe trench; and
alternately forming first material layers and second material layers on the second conductive layer with the second sacrificial layer formed therein.

* * * * *